(12) United States Patent
Fujita et al.

(10) Patent No.: US 7,969,237 B2
(45) Date of Patent: Jun. 28, 2011

(54) SEMICONDUCTOR INTEGRATED CIRCUIT DEVICE

(75) Inventors: Tetsuya Fujita, Kanagawa (JP); Yousuke Hagiwara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 12/623,794

(22) Filed: Nov. 23, 2009

(65) Prior Publication Data

US 2010/0259316 A1  Oct. 14, 2010

(30) Foreign Application Priority Data

Apr. 8, 2009  (JP) .................................. 2009-094271

(51) Int. Cl.
  *G05F 1/10*  (2006.01)
(52) U.S. Cl. ........................................................ 327/545
(58) Field of Classification Search .................. 327/535, 327/537, 540, 541, 543, 545, 546, 565, 566
See application file for complete search history.

(56) References Cited

U.S. PATENT DOCUMENTS

| 6,876,252 | B2 * | 4/2005 | Kim et al. ...................... 327/544 |
| 7,750,729 | B2 * | 7/2010 | Lee et al. ...................... 327/544 |
| 7,840,926 | B2 * | 11/2010 | Kim et al. ..................... 716/119 |
| 7,863,971 | B1 * | 1/2011 | Nayak et al. .................. 327/546 |

FOREIGN PATENT DOCUMENTS

JP   2008-034667   2/2008

* cited by examiner

*Primary Examiner* — Jeffrey S Zweizig
(74) *Attorney, Agent, or Firm* — Turocy & Watson, LLP

(57) ABSTRACT

A semiconductor integrated circuit device includes at least one first transistor configured to control conductance between an input power line and an output power line, at least one second transistor configured to control conductance between the input power line and the output power line, a first buffer configured to supply a first control signal for driving the at least one first transistor to a first control line connected to the at least one first transistor, a second buffer configured to generate a second control signal for driving the at least one second transistor upon receipt of the first control signal supplied through the first control line and supply the second control signal to a second control line connected to the at least one second transistor, and at least one capacitor connected between the first control line and the output power line.

20 Claims, 13 Drawing Sheets

SEMICONDUCTOR INTEGRATED CIRCUIT DEVICE

CROSS-REFERENCE TO RELATED APPLICATION

This application is based upon and claims the benefit of priority from the prior Japanese Patent Applications No. 2009-094271 filed in Japan on Apr. 8, 2009; the entire contents of which are incorporated herein by reference.

BACKGROUND OF THE INVENTION

1. Field of the Invention

The present invention relates to a semiconductor integrated circuit device effectively used for, e.g., a power consumption reduction technique for cutting off power to a logic block in a standby state.

2. Description of the Related Art

Various power consumption reduction techniques have conventionally been adopted in semiconductor integrated circuit devices. For example, a power switch configured to cut off supply of power to a logic block in a standby state may be adopted to reduce power consumption. More specifically, a power switch is provided between a virtual power line as a power source inside a semiconductor integrated circuit device (hereinafter referred to as a virtual power source) and a power source outside the semiconductor integrated circuit device (an external power source), thereby controlling supply of power from the external power source to the virtual power line.

Power is supplied to a logic block in a standby state and an activated logic block from power switches different from each other. Rush current may be generated at an instant when the power switch is turned on to activate a logic block in a standby state. If rush current occurs, a power line voltage of the external power source varies, and supply of power to another activated logic block becomes unstable, which may cause the logic block to malfunction.

For this reason, Japanese Patent Application Laid-Open Publication No. 2008-34667 (hereinafter referred to as Document 1) discloses a technique for preventing rush current. According to the technique in Document 1, a transistor is adopted as a power switch, and a capacitor is connected between a gate and a drain of a transistor, which prevents generation of rush current. Also, according to the technique in Document 1, a control circuit is provided, a time required for a rise in a power line voltage to 100% of a final value is predicted from a difference between a time which elapses before the power line voltage rises to 30% and a time which elapses before the power line voltage rises to 60%, and a transistor is fully turned on. The configuration allows reliable power supply and achieves less power consumption.

However, fine adjustment for controlling a rise in power line voltage to be gentle is extremely difficult in control of power switches to be collectively controlled using capacitors, and control of rush current is difficult for the technique in Document 1. In addition, the technique in Document 1 requires a circuit for predicting, from a rise in power line voltage, when to fully turn on a main switch and suffers from the problem of a large circuit scale.

BRIEF SUMMARY OF THE INVENTION

A semiconductor integrated circuit device according to one aspect of the present invention includes at least one first transistor configured to control conductance between an input power line and an output power line, at least one second transistor configured to control conductance between the input power line and the output power line, a first buffer configured to supply a first control signal for driving the at least one first transistor to a first control line connected to the at least one first transistor, a second buffer configured to generate a second control signal for driving the at least one second transistor upon receipt of the first control signal supplied through the first control line and supply the second control signal to a second control line connected to the at least one second transistor, and at least one capacitor connected between the first control line and the output power line.

DETAILED DESCRIPTION OF THE INVENTION

Embodiments of the present invention will be described in detail below with reference to the drawings.

First Embodiment

Figure 1:
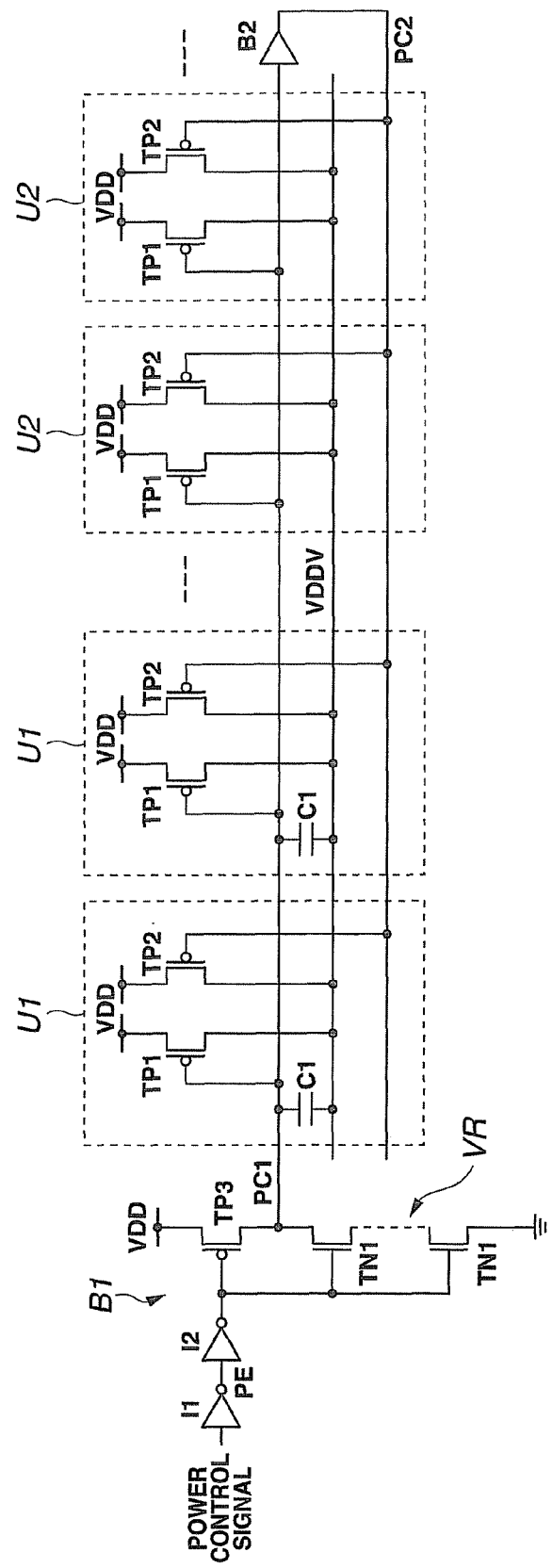
FIG. 1 is a circuit diagram showing a semiconductor integrated circuit according to a first embodiment of the present invention.

FIG. 1 is a circuit diagram showing a semiconductor integrated circuit device according to a first embodiment of the present invention. The semiconductor integrated circuit device in FIG. 1 constitutes a power control device. A power line voltage from a power source provided outside the semiconductor integrated circuit device is supplied to the semiconductor integrated circuit device through a power line VDD as an input power line. A virtual power line VDDV for supplying the power line voltage to an internal logic circuit (not shown) is provided in the semiconductor integrated circuit device. A logic circuit (not shown) is connected to the virtual power line VDDV as an output power line.

In the present embodiment, a plurality of power switch sections U1 and a plurality of power switch sections U2 are provided between the power line VDD and the virtual power line VDDV. The power switch section U1 is composed of PMOS transistors TP1 and TP2 whose drain-to-source channels are connected between the power line VDD and the virtual power line VDDV and a capacitor C1. The transistor TP1 has a gate connected to a control line PC1, and conductance of the drain-to-source channel is controlled by a first control signal supplied through the control line PC1.

The control line PC1 is connected to an input pin of a buffer B2, and an output pin of the buffer B2 is connected to a control line PC2. The buffer B2 is configured to output, to the control line PC2, a second control signal whose output level is inverted when the first control signal supplied through the control line PC1 exceeds a threshold value. The transistor TP2 has a gate connected to the control line PC2, and conductance of the drain-to-source channel is controlled by the second control signal supplied through the control line PC2.

The power switch section U2 is composed of the PMOS transistors TP1 and TP2 whose drain-to-source channels are connected between the power line VDD and the virtual power line VDDV. Configurations of the transistors TP1 and TP2 in the power switch section U2 are the same as configurations of the transistors TP1 and TP2 in the power switch section U1.

In the present embodiment, the power switch section U1 has the capacitor C1 provided between the control line PC1 and the virtual power line VDDV. A combined capacitance between the control line PC1 and the virtual power line VDDV is given by a capacitance of each capacitor C1×the number of power switch sections U1. In the present embodiment, the number of power switch sections U1 is determined on the basis of a combined capacitance required between the control line PC1 and the virtual power line VDDV, as will be described later.

A transistor size of each transistor TP2 is set to be larger than a transistor size of each transistor TP1. The configuration causes the transistors TP2 to supply sufficient power to the virtual power line VDDV in steady state. As will be described later, the configuration also causes the power line voltage to rise gradually while rush current is suppressed by the transistors TP1, at the beginning of supply of power to the virtual power line VDDV.

The first control signal to be supplied to the control line PC1 is provided from a buffer B1. The buffer B1 is composed of inverters I1 and I2, a PMOS transistor TP3, and a plurality of NMOS transistors TN1. A power control signal for controlling supply of power to a logic circuit (not shown) is supplied to the inverter I1. The inverter I1 outputs an inverted signal PE which is obtained by inverting the power control signal to the inverter I2. The inverter I2 inverts and outputs the inverted signal PE.

A drain-to-source channel of the transistor TP3 and drain-to-source channels of the plurality of transistors TN1 are series-connected between the power line VDD and a ground. The plurality of transistors TN1 constitute an on-resistance section VR. The control line PC1 is connected to a drain of the transistor TP3 and a drain of the transistor TN1. A power control signal from the inverter I2 is applied to gates of the transistor TP3 and the transistors TN1.

Figure 2:
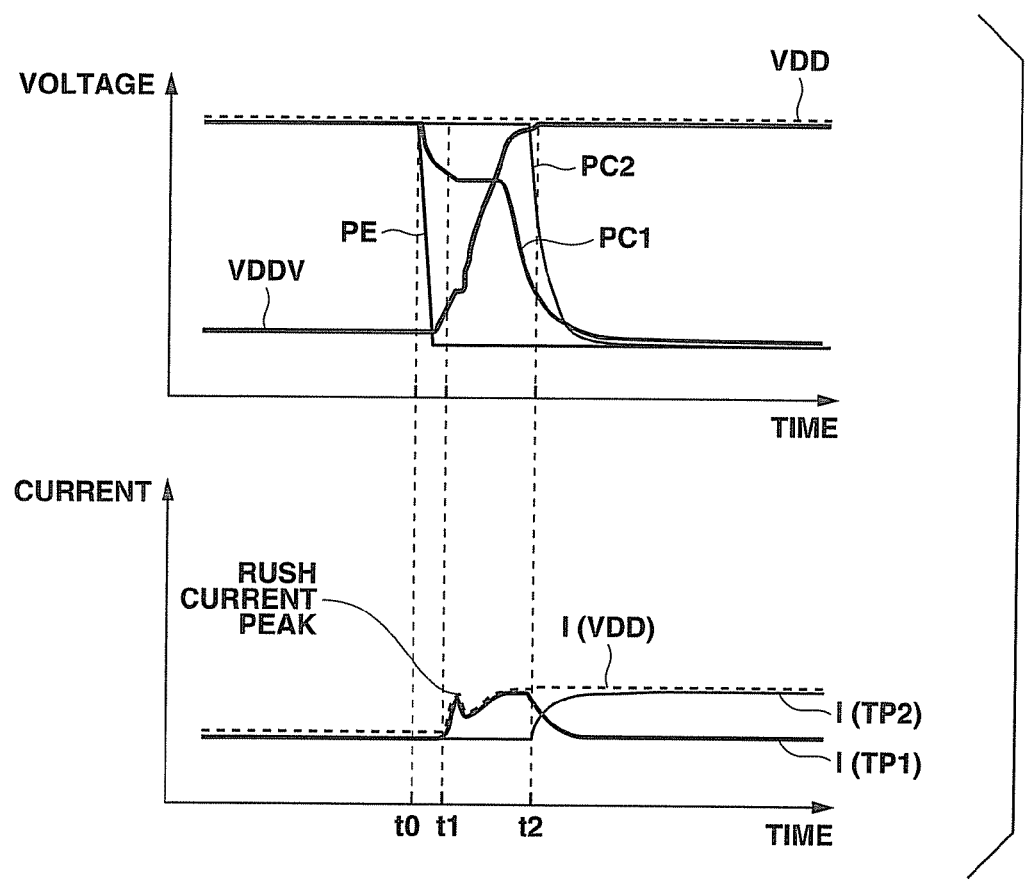
FIG. 2 is waveform charts for explaining operation of the first embodiment, in each of which an abscissa represents time, and an ordinate represents voltage or current.

Operation of the embodiment with the above-described configuration will be described with reference to FIG. 2. FIG. 2 shows waveform charts for explaining operation of the first embodiment, in each of which an abscissa represents time, and an ordinate represents voltage or current. Reference characters VDD in FIG. 2 denote a voltage at the power line VDD, reference characters VDDV denote a voltage at the virtual power line VDDV, reference characters PE denote a voltage of the inverted signal PE, reference characters PC1 denote a voltage of the first control signal, and reference characters PC2 denote a voltage of the second control signal. Reference characters I(VDD) in FIG. 2 denote a current at the power line VDD, reference characters I(TP1) denote a drain current at the transistor TP1, and reference characters I(TP2) denote a drain current at the transistor TP2.

Assume that a logic circuit, power supply to which is controlled by the power control device in FIG. 1, is now in a standby state. In the state, the power control signal is low level (hereinafter referred to as L level). The inverted signal PE from the inverter I1 is high level (hereinafter referred to as H level), and the power control signal from the inverter I2 is L level.

The output from the inverter I2 is supplied to the gates of the transistors TP3 and TN1, the transistor TP3 is ON, and the transistor TN1 is OFF. Accordingly, the first control signal appearing on the control line PC1 and the second control signal appearing on the control line PC2 are both H level. For this reason, the transistors TP1 and TP2 are OFF, the power switches U1 and U2 are brought out of conduction, and power from the power line VDD is not supplied to the virtual power line VDDV.

Assume here that the power control signal changes from L level to H level in order to activate the logic circuit. As shown in FIG. 2, the inverted signal PE changes relatively quickly from H level to L level at time t0. The change causes, of the transistors TP3 and TN1 constituting the buffer B1, the transistor TP3 to be turned off and the transistors TN1 to be turned on, and the first control signal on the control line PC1 transitions from H level to L level.

The first control signal varies depending on a time constant (hereinafter referred to a transition time constant for the first control signal) based on capacitance components and resistance components connected to the control line PC1. The capacitance components connected to the control line PC1 include the plurality of capacitors C1 and gate capacitances of the plurality of transistors TP1. The resistance components connected to the control line PC1 include an on-resistance of the on-resistance section VR composed of the plurality of transistors TN1. That is, the first control signal transitions from H level to L level according to the transition time constant for the first control signal determined on the basis of the plurality of capacitors C1, the gate capacitances of the plurality of transistors TP1, and the on-resistance of the plurality of transistors TN1.

When the first control signal changes from H level to L level, as indicated in a period (t0-t1) in FIG. 2, the transistors TP1 gradually shifts to ON, current starts to flow from the power line VDD to the virtual power line VDDV, and the voltage at the virtual power line VDDV starts to rise. In the present embodiment, the transition time constant for the first control signal is appropriately set, and a level of the first control signal changes relatively slowly.

The first control signal is supplied to the control line PC2 through the buffer B2. The buffer B2 inverts an output if an input exceeds a threshold value. At time t1, the output from the buffer B2 remains H level. Accordingly, the transistors TP2 are OFF during the period.

When the voltage at the virtual power line VDDV rises gradually, and time t1 is reached, the capacitors C1 connected between the control line PC1 and the virtual power line VDDV suppress a change in the voltage of the first control signal of the control line PC1, i.e., a change from H level to L level in the level of the first control signal.

For this reason, the level of the first control signal changes little for a predetermined period after time t1, as shown in FIG. 2. Accordingly, the transistors TP1 connected to the control line PC1 do not become fully ON and remain slightly conducting. That is, the amount of current flowing from the power line VDD to the virtual power line VDDV is small, and, as indicated by I(TP1) and I(VDD) in FIG. 2, rush current is sufficiently suppressed.

The voltage at the virtual power line VDDV rises gently. At a time shortly before time t2, the voltage at the virtual power line VDDV becomes close to the voltage at the power line VDD, and a change in the voltage becomes remarkably small. At the time, the level of the first control signal on the control line PC1 starts to fall again according to the transition time constant for the first control signal.

Nearly at time t2 where the level of the first control signal becomes sufficiently low, the transistors TP1 become nearly fully ON. When the level of the first control signal exceeds a threshold value, the buffer B2 is turned on. The second control signal on the control line PC2 changes quickly from H level to L level at time t2.

The change causes the transistors TP2 to be turned on. Current flows from the power line VDD to the virtual power line VDDV through the drain-to-source channels of the transistors TP1 and TP2, and the voltage at the virtual power line VDDV nearly coincides with the voltage at the power line VDD. Note that, in steady state, the current I(TP2), which flows through the transistor TP2, is sufficiently larger than the current I(TP1), which flows through the transistor TP1, as shown in FIG. 2.

That is, in the present embodiment, the capacitors C1 are provided between the virtual power line VDDV and the control line PC1. With the capacitors C1, feedback control including suppression of a change in the level of the first control signal is performed in keeping with a rise in the voltage at the virtual power line VDDV. The feedback control causes a gate potential of each transistor TP1 to remain at an intermediate potential for a relatively long period during the rise in the voltage at the virtual power line VDDV. Accordingly, current which flows through the drain-to-source channels of the transistors TP1 is suppressed, and rush current which is generated at the beginning of supply of power to the logic circuit connected to the virtual power line VDDV is suppressed.

Since a change in the level of the first control signal is suppressed by the capacitors C1, there is a sufficient delay time from when the voltage at the virtual power line VDDV starts rising to when the transistors TP2 are turned on. When the transistors TP2 are turned on, the voltage at the virtual power line VDDV stops rising. Accordingly, a rising rate of the voltage at the virtual power line VDDV becomes low, and rush current is suppressed.

A gate voltage of each transistor TP1 remains for a sufficient time at an intermediate voltage, where the voltage at the virtual power line VDDV starts transitioning, close to a threshold value for the transistor TP1. Accordingly, even if the threshold values for the transistors TP1 vary due to manufacturing variations, the transistors TP1 hold an equal on-current state regardless of variations. In the present embodiment, the power control device is thus capable of operating as desired, regardless of manufacturing variations between elements.

A delay time from when the voltage at the virtual power line VDDV starts transitioning to when the transistors TP2 are turned on, and the voltage at the virtual power line VDDV reaches the voltage at the power line VDD is determined by a rate of change in the first control signal on the control line PC1. The rate of change is determined by the capacitance of each capacitor C1 and the transition time constant for the first control signal. The capacitor C1 has a terminal connected to the virtual power line VDDV, and a terminal voltage transitions from 0 V to a potential equivalent to a potential at the power line VDD. Accordingly, an apparent capacitance of each capacitor C1 is twice an actual capacitance, and it is possible to achieve, with a relatively small capacitance, a sufficient delay time to when the transistors TP2 are turned on.

When suppression of rush current is taken into consideration, possible examples of a necessary delay time to when the transistors TP2 are turned on include a time on the order of one microsecond. Accordingly, for example, the capacitance of each capacitor C1 is set to 3 pF, and an on-resistance of the plurality of transistors TN1 if an output from the buffer B1 is L level is set to about 160 kΩ. The setting allows the delay time to when the transistors TP2 are turned on to be on the order of one microsecond.

As described above, in the present embodiment, two types of transistors different in gate width are used. Use of the transistor with a small gate width makes it easier for a power line voltage to rise gently, and control is performed by appropriately setting a transition time constant for a first control signal by setting of the numbers of the power switch sections U1 and U2 such that the power line voltage at a virtual power line changes at a desired rate. Additionally, a capacitor is provided between a control line and the virtual power line. Generation of rush current is prevented by feedback-controlling the first control signal, continuing supply of an intermediate potential to a gate of the transistor with the small gate width for a relatively long time, and suppressing flow of a drain current.

When the power line voltage at the virtual power line nearly stops rising, a level of the first control signal restarts falling, a second control signal is inverted, the transistor with a large gate width is turned on, and the power line voltage at the virtual power line reaches a voltage at a power line. Accordingly, the present embodiment does not require a circuit configured to detect a rise in a power line voltage and is capable of stably supplying a power line voltage while suppressing rush current with simple configuration.

(Modification)

Figure 3:
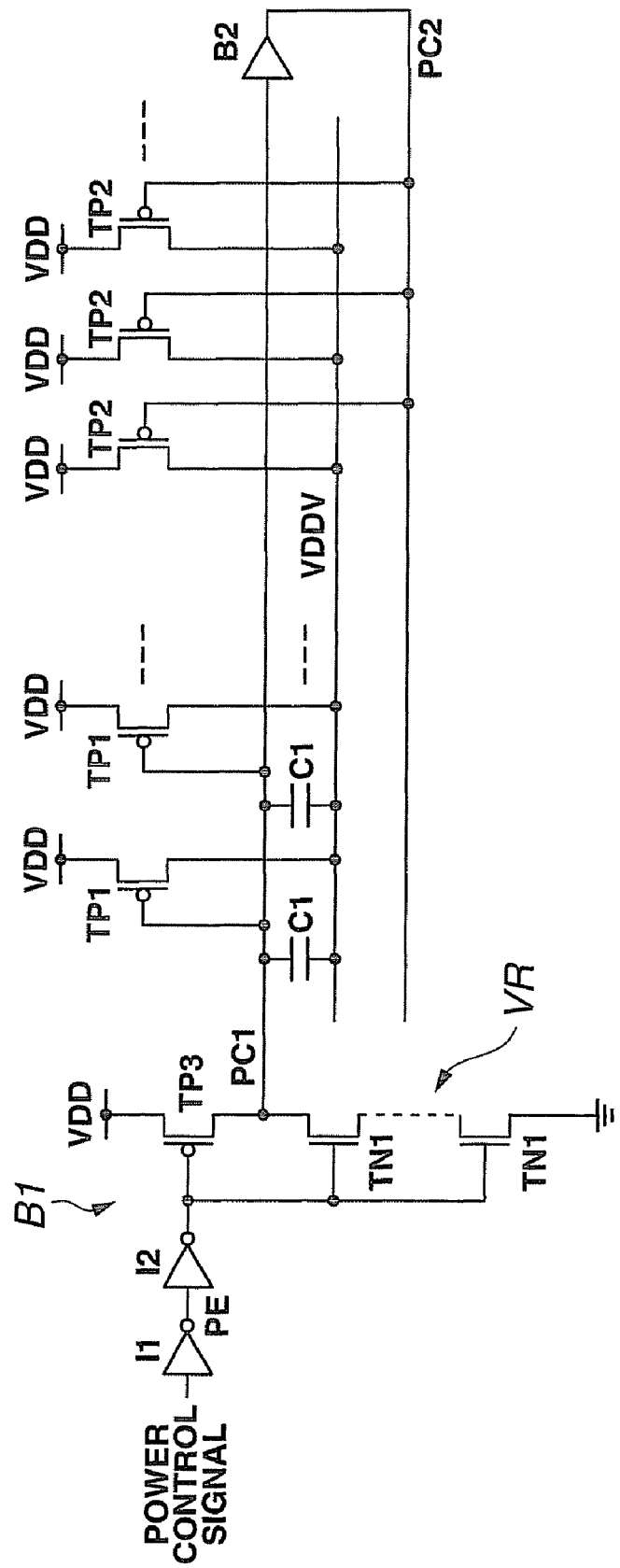
FIG. 3 is a circuit diagram showing a modification of the first embodiment.

FIG. 3 is a circuit diagram showing a modification of the first embodiment.

In the embodiment in FIG. 1, the transistors TP1 and the transistors TP2 are configured to have gate widths different from each other. With the configuration, each transistor TP1 with a small gate width is turned on to cause a power line voltage to change gently at the beginning of supply of power, and each transistor TP2 with a large gate width is turned on at the end of a rise in power line voltage, thereby allowing reliable power supply.

However, even if the transistors TP1 and TP2 are made to have the same gate widths, the same effects as in the case of the different gate widths can be obtained by making the number of transistors TP2 larger than the number of transistors TP1.

The modification in FIG. 3 is different from the first embodiment in that the number of transistors TP1 and the number of transistors TP2 are different from each other. The same working effects as in the first embodiment can be obtained by appropriately setting the number of transistors TP1 (the number of capacitors C1) and the number of transistors TP2.

Note that an example in which the capacitors C1 equal in number to the transistors TP1 are provided is shown in each of FIGS. 1 and 3. A capacitance between the power line VDD and the virtual power line VDDV is determined by a capacitance of each capacitor C1×the number of capacitors C1. Accordingly, the number of capacitors C1 may be reduced by increasing the capacitance of each capacitor C1. For example, only one capacitor C1 may be provided. The capacitor (capacitors) C1 needs (need) to be provided such that a combined capacitance which includes gate capacitances and wiring capacitances of the transistors and is connected to the control line PC1 is a capacitance required to set a transition time constant for a first control signal to an appropriate value.

Similarly, appropriate setting of the gate widths of the transistors TP1 and the transistors TP2 makes it possible to provide only one transistor TP1 and only one transistor TP2.

Although an on-resistance for determining the transition time constant for the first control signal is obtained by series-connecting the plurality of transistors TN1 in each of the examples in FIGS. 1 and 3, any configuration may be used to obtain an on-resistance. For example, transistors may be connected in parallel, or elements other than transistors may be used.

Figure 4:
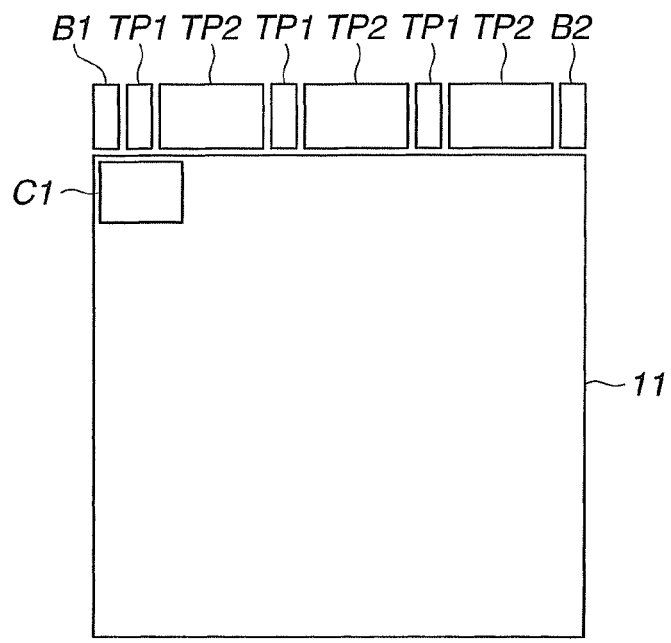
FIG. 4 is a layout diagram showing a layout when the circuit in FIG. 1 is configured on an LSI.
Figure 5:
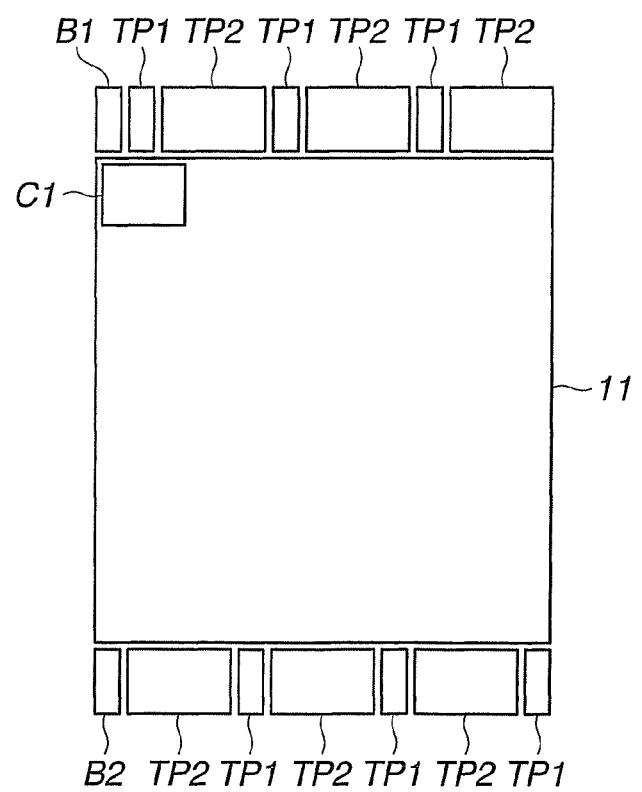
FIG. 5 is a layout diagram showing a layout when the circuit in FIG. 1 is configured on the LSI.
Figure 6:
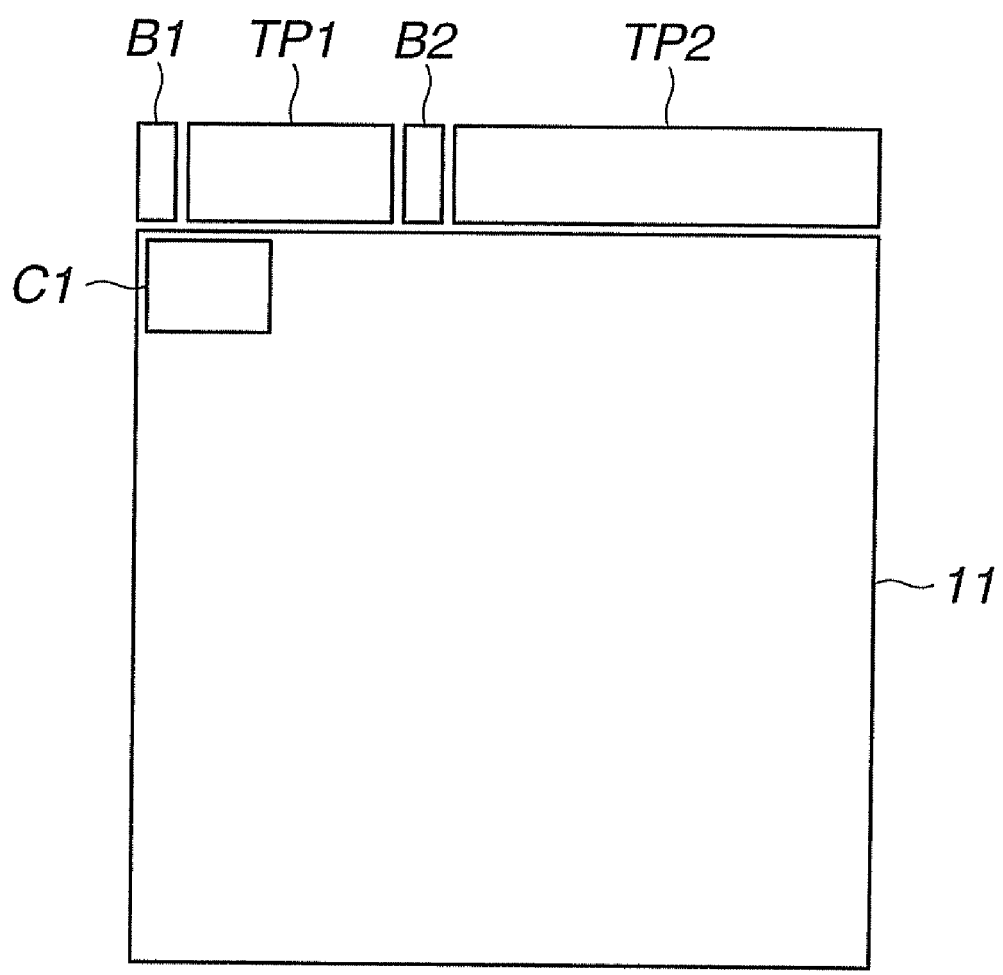
FIG. 6 is a layout diagram showing a layout when the circuit in FIG. 3 is configured on the LSI.

FIGS. 4 and 5 are each a layout diagram showing a layout when the circuit in FIG. 1 is configured on an LSI. FIG. 6 is a layout diagram showing a layout when the circuit in FIG. 3 is configured on the LSI.

Elements are arranged along one or a plurality of sides of a region constituting a logic circuit 11 configured to receive power from the virtual power line VDDV.

FIG. 4 shows how the circuit in FIG. 1 is arranged. Reference characters B1 and B2 in FIG. 4 denote formation regions for the buffers B1 and B2 in FIG. 1, reference characters TP1 and TP2 in FIG. 4 denote formation regions for the transistors TP1 and TP2 in FIG. 1, and reference characters C1 in FIG. 4 denote a formation region for the capacitor C1 in FIG. 1. The buffers B1 and B2, the transistors TP1 and TP2, and the capacitor C1 are provided along one side of the region constituting the logic circuit 11 to be supplied with power.

In FIG. 4, the buffer B1 and the capacitor C1 are provided at one end of one side of the logic circuit 11. The transistors TP1 and TP2 are sequentially and repeatedly arranged along one side of the logic circuit 11, starting from a point adjacent to the buffer B1. The buffer B2 is arranged at the other end of the one side of the logic circuit 11.

An output pin of the buffer B1 is connected to the terminal of the capacitor C1 and gates of the transistors TP1 through the control line PC1 (not shown). The control line PC1 is connected to an input pin of the buffer B2, and an output pin of the buffer B2 is connected to gates of the transistors TP2 through the control line PC2 (not shown).

FIG. 5 shows an example in which elements are arranged along upper and lower sides of the logic circuit 11. The capacitor C1, the buffer B1, and the transistors TP1, TP2, TP1, TP2, . . . are arranged along the upper side in FIG. 5, in order from a left side of a sheet surface. On the other hand, the buffer B2 and the transistors TP2, TP1, TP2, TP1, . . . are arranged along the lower side in FIG. 5, in order from the left side of the sheet surface.

FIG. 6 shows how the circuit in FIG. 3 is arranged. Reference characters B1 and B2 in FIG. 6 denote formation regions for the buffers B1 and B2 in FIG. 3, reference characters TP1 and TP2 in FIG. 6 denote formation regions for the transistors TP1 and TP2 in FIG. 3, and reference characters C1 in FIG. 6 denote a formation region for the capacitor C1 in FIG. 3. The buffers B1 and B2, the transistors TP1 and TP2, and the capacitor C1 are provided along one side of the region constituting the logic circuit 11 to be supplied with power.

In FIG. 6, the buffer B1 and the capacitor C1 are provided at one end of one side of the logic circuit 11. The plurality of transistors TP1 are arranged along the one side of the logic circuit 11, starting from a point adjacent to the buffer B1. The output pin of the buffer B1 is connected to the terminal of the capacitor C1 and the gates of the transistors TP1 through the control line PC1 (not shown).

The buffer B2 is arranged next to the transistors TP1. The plurality of transistors TP2 are arranged next to the buffer B2. The control line PC1 is connected to the input pin of the buffer B2, and the output pin of the buffer B2 is connected to the gates of the transistors TP2 through the control line PC2 (not shown).

Note that although an example in which the plurality of capacitors C1 is provided in one region is shown in each of FIGS. 4 and 6, the capacitors C1 may be provided in a plurality of separate regions.

Second Embodiment

Figure 7:
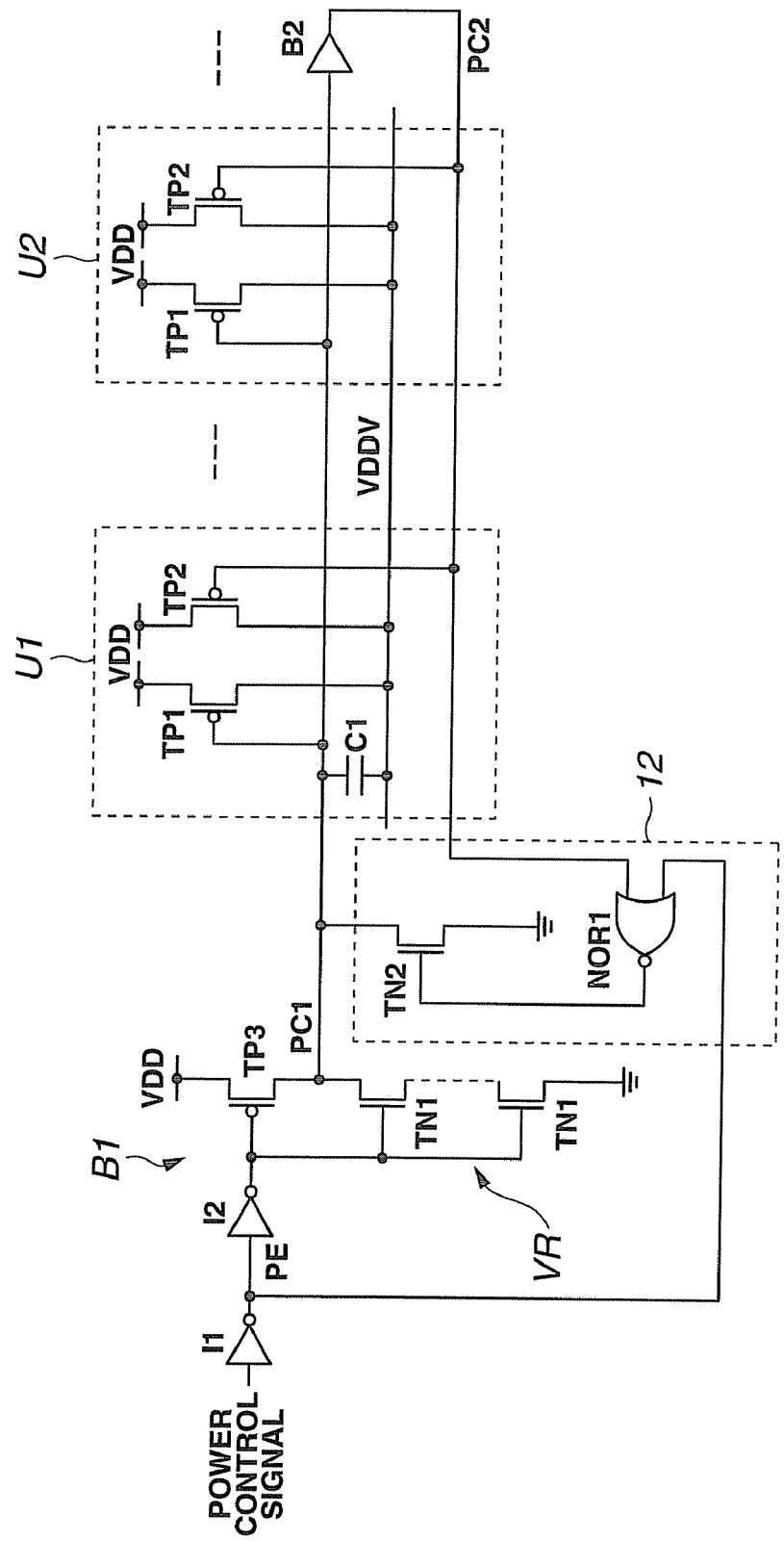
FIG. 7 is a circuit diagram showing a second embodiment of the present invention.

FIG. 7 is a circuit diagram showing a second embodiment of the present invention. In FIG. 7, the same components as in FIG. 1 are denoted by the same reference numerals, and a description of the components will be omitted.

A transition time constant for a first control signal can be set to a value which increases with an increase in a value of an on-resistance connected to a control line PC1. However, leak current in gates of transistors TP1 may bring about a situation in which the on-resistance with a relatively high resistance value connected to the control line PC1 prevents the first control signal from falling to a ground and the transistors TP1 from being fully turned on even after transistors TP2 are turned on.

If the first control signal does not reach the ground due to effects of the leak current in the gates of the transistors TP1 and the on-resistance, through current may flow to a buffer B2 to increase power consumption.

For this reason, a drive circuit 12 for fully turning on the transistors TP1 after the transistors TP2 are turned on is added in the present embodiment. The present embodiment is different from the first embodiment only in that the drive circuit 12 is added.

The drive circuit 12 is composed of an NMOS transistor TN2 and a NOR circuit NOR1. Not only a second control signal from a control line PC2 but also an inverted signal PE from an inverter I1 are input to the NOR circuit NOR1. The NOR circuit NOR1 performs a NOR operation on the second control signal and the inverted signal PE and supplies an operation result to a gate of the transistor TN2. The transistor TN2 has a drain connected to the control line PC1 and a source connected to a ground and is brought into conduction when an output from the NOR circuit NOR1 changes to H level. With the configuration, a driving force for the first control signal is enhanced, and the first control signal is made to transition fully to L level.

Figure 8:
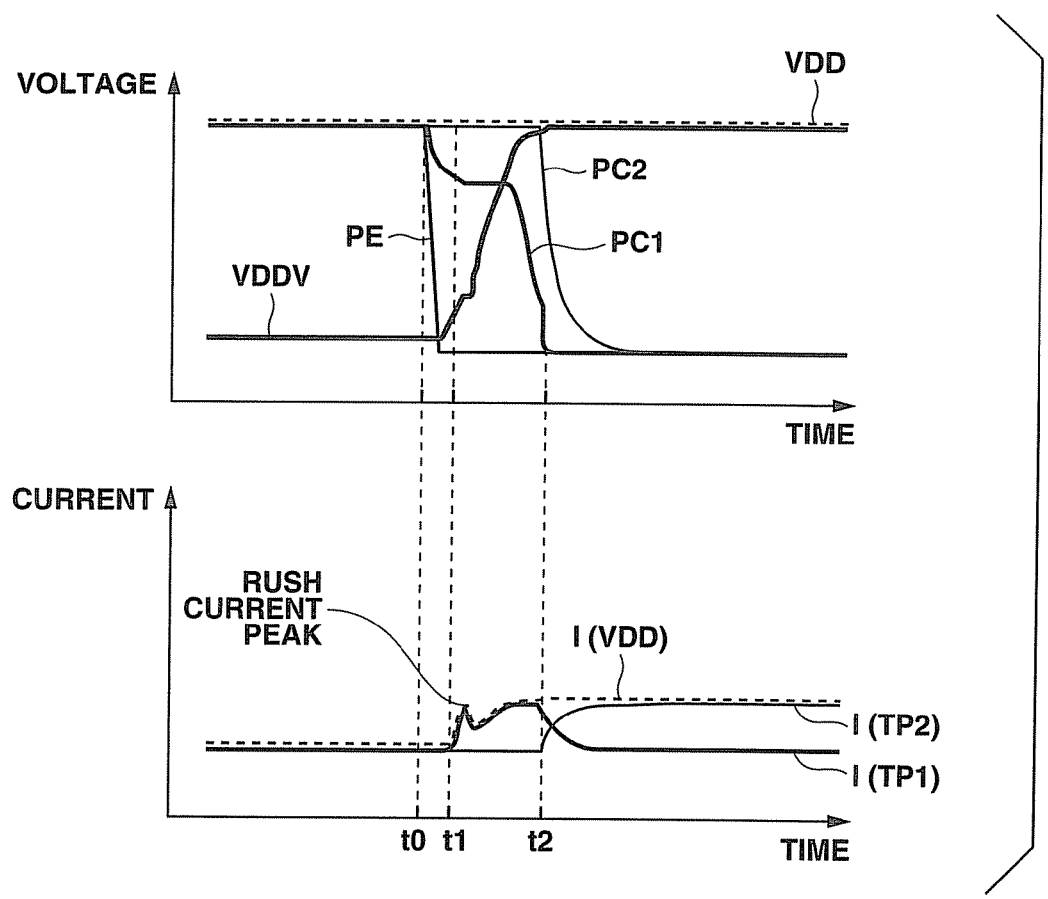
FIG. 8 is waveform charts for explaining operation of the second embodiment, in each of which an abscissa represents time, and an ordinate represents voltage or current.

Operation of the embodiment with the above-described configuration will be described with reference to FIG. 8. FIG. 8 shows waveform charts for explaining the operation of the second embodiment, in each of which an abscissa represents time, and an ordinate represents voltage or current. Reference characters VDD in FIG. 8 denote a voltage at a power line VDD, reference characters VDDV denote a voltage at a virtual power line VDDV, reference characters PE denote a voltage of the inverted signal PE, reference characters PC1 denote a voltage of the first control signal, and reference characters PC2 denote a voltage of the second control signal. Reference characters I(VDD) in FIG. 8 denote a current at the power line VDD, reference characters I(TP1) denote a drain current at the transistor TP1, and reference characters I(TP2) denote a drain current at the transistor TP2.

Operation during a period when a power control signal changes from L level to H level, the first control signal transitions from H level to L level to exceeds a threshold value for the buffer B2, and an output from the buffer B2 is quickly inverted is the same as in the first embodiment. The second control signal on the control line PC2 changes quickly from H level to L level, which causes the transistors TP2 to be turned on.

In the present embodiment, the second control signal is input to the NOR circuit NOR1. As shown in FIG. 8, after time t0, the inverted signal PE is L level. A change of the second control signal to L level changes the output from the NOR circuit NOR1 to H level. The output of an H level causes the transistor TN2 to be turned on, the control line PC1 to be changed to ground level, and the first control signal to fall quickly to the L level, as shown in FIG. 8.

For this reason, the transistors TP1 are forced fully ON. That is, all the transistors TP1 and TP2 are fully turned on, current flows from the power line VDD to the virtual power line VDDV through drain-to-source channels of the transistors TP1 and TP2, and the voltage at the virtual power line VDDV nearly coincides with the voltage at the power line VDD.

As described above, according to the present embodiment, the same effects as in the first embodiment can be obtained. Additionally, since a level of the first control signal certainly falls to the L level when the transistors TP2 are turned on, it is possible to prevent through current from flowing through the buffer B2 and suppress an increase in power consumption. A signal for turning on the transistors TP1 is generated by a simple circuit using the second control signal, and the present embodiment can also be configured on a relatively small circuit scale.

Figure 9:
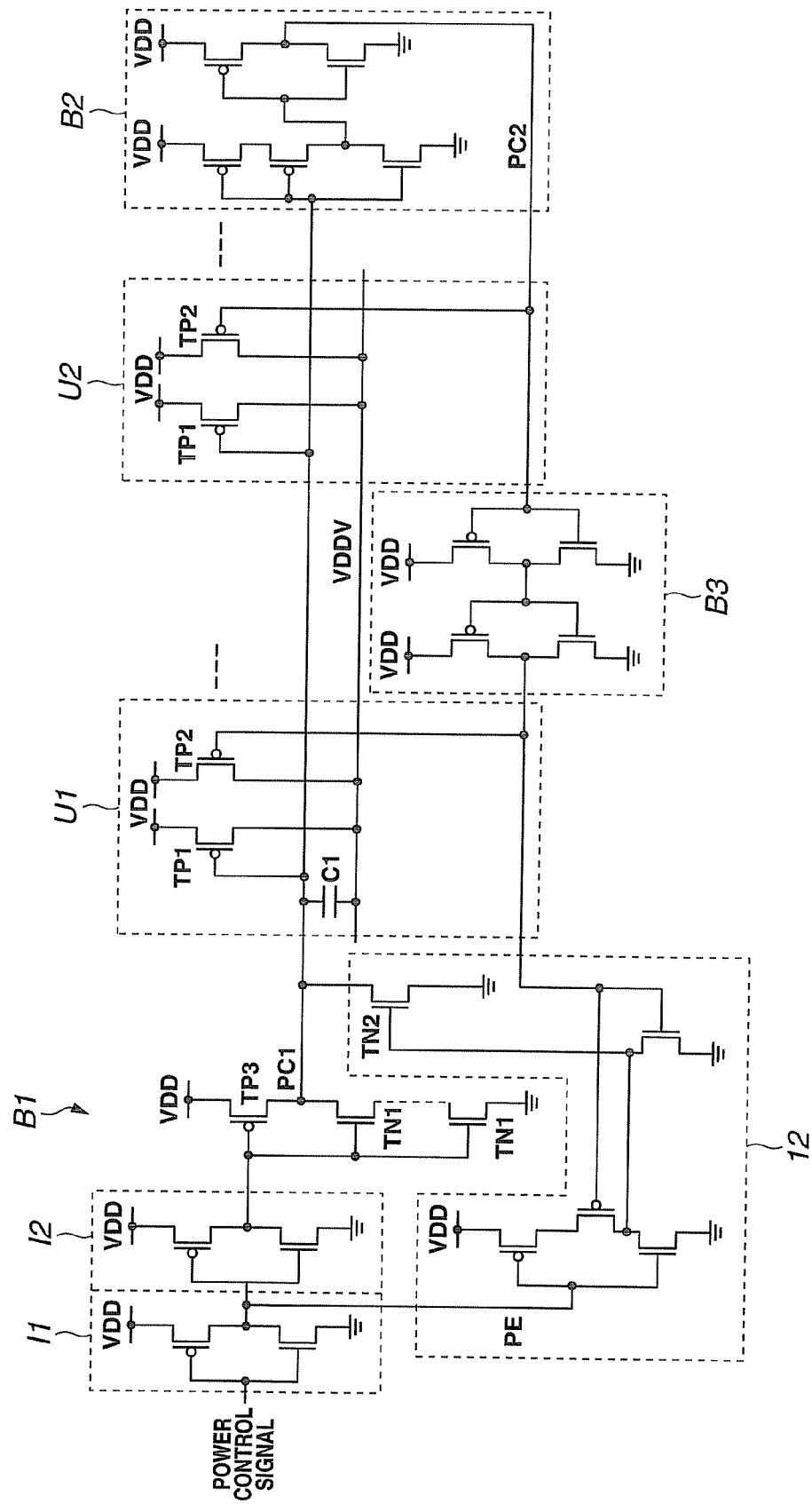
FIG. 9 is a circuit diagram showing an example of a specific circuit of the circuit in FIG. 7.

FIG. 9 is a circuit diagram showing an example of a specific circuit of the circuit in FIG. 7.

The buffer B2 configured to generate the second control signal needs to relatively quickly invert the second control signal and fully turn on the transistors TP2. If a driving force of the buffer B2 for turning on the transistors TP2 is insufficient, buffers may be added at parts of the control line PC2. FIG. 9 shows an example in which a buffer B3 is added to the control line PC2 in consideration of this point. Note that, in FIG. 9, a circuit section corresponding to each section in FIG. 7 is indicated by broken lines surrounding the circuit section.

Figure 10:
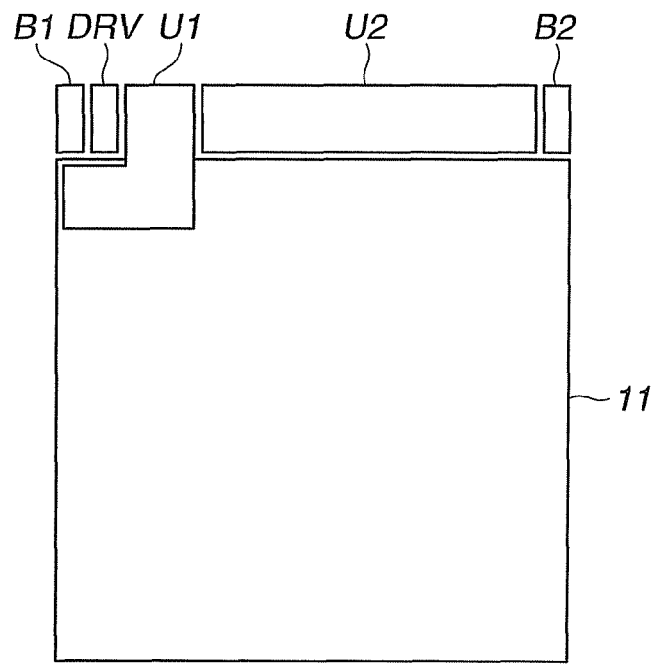
FIG. 10 is a layout diagram showing a layout when the circuit in FIG. 7 is configured on an LSI.
Figure 11:
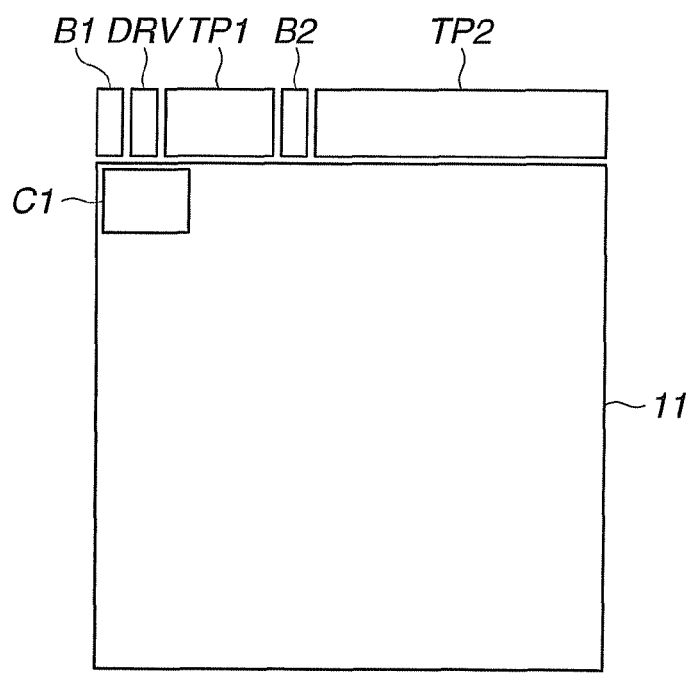
FIG. 11 is a layout diagram showing a layout when the circuit in FIG. 7 is configured on the LSI.

FIGS. 10 and 11 are each a layout diagram showing a layout when the circuit in FIG. 7 is configured on an LSI.

Reference characters B1 and B2 in FIGS. 10 and 11 denote formation regions for the buffers B1 and B2 in FIG. 7, reference characters U1 and U2 in FIGS. 10 and 11 denote formation regions for power switch sections U1 and U2 in FIG. 7, and reference characters DRV in FIGS. 10 and 11 denote a formation region for the drive circuit 12 in FIG. 7. The buffers B1 and B2, the power switch sections U1 and U2, and the drive circuit 12 are provided along one side of a region constituting a logic circuit 11 to be supplied with power.

In FIG. 10, the buffer B1, the drive circuit 12, the plurality of power switch sections U1, the power switch sections U2, and the buffer B2 are arranged in the order along one side of the logic circuit 11. The control line PC1 (not shown) extends from the buffer B1 arranged at one end of the one side of the logic circuit 11 and an output pin of the drive circuit 12 through a connection to the gate of the transistor TP1 of the power switch section U1 and a connection to the gate of the transistor TP1 of the power switch section U2 to an input pin of the buffer B2 arranged at the other end of the one side of the logic circuit 11. The control line PC2 (not shown) extends from an output pin of the buffer B2 through a connection to a gate of the transistor TP2 of the power switch section U2 and a connection to a gate of the transistor TP2 of the power switch section U1 to an input pin of the drive circuit 12. Note that the power switch section U1 is configured to include a capacitor C1 in FIG. 10.

The example in FIG. 11 is an example which is obtained by applying the layout in FIG. 10 to the configuration in FIG. 3 and in which the plurality of transistors TP1 are arranged adjacent to each other, and the plurality of transistors TP2 are arranged adjacent to each other.

Figure 12:
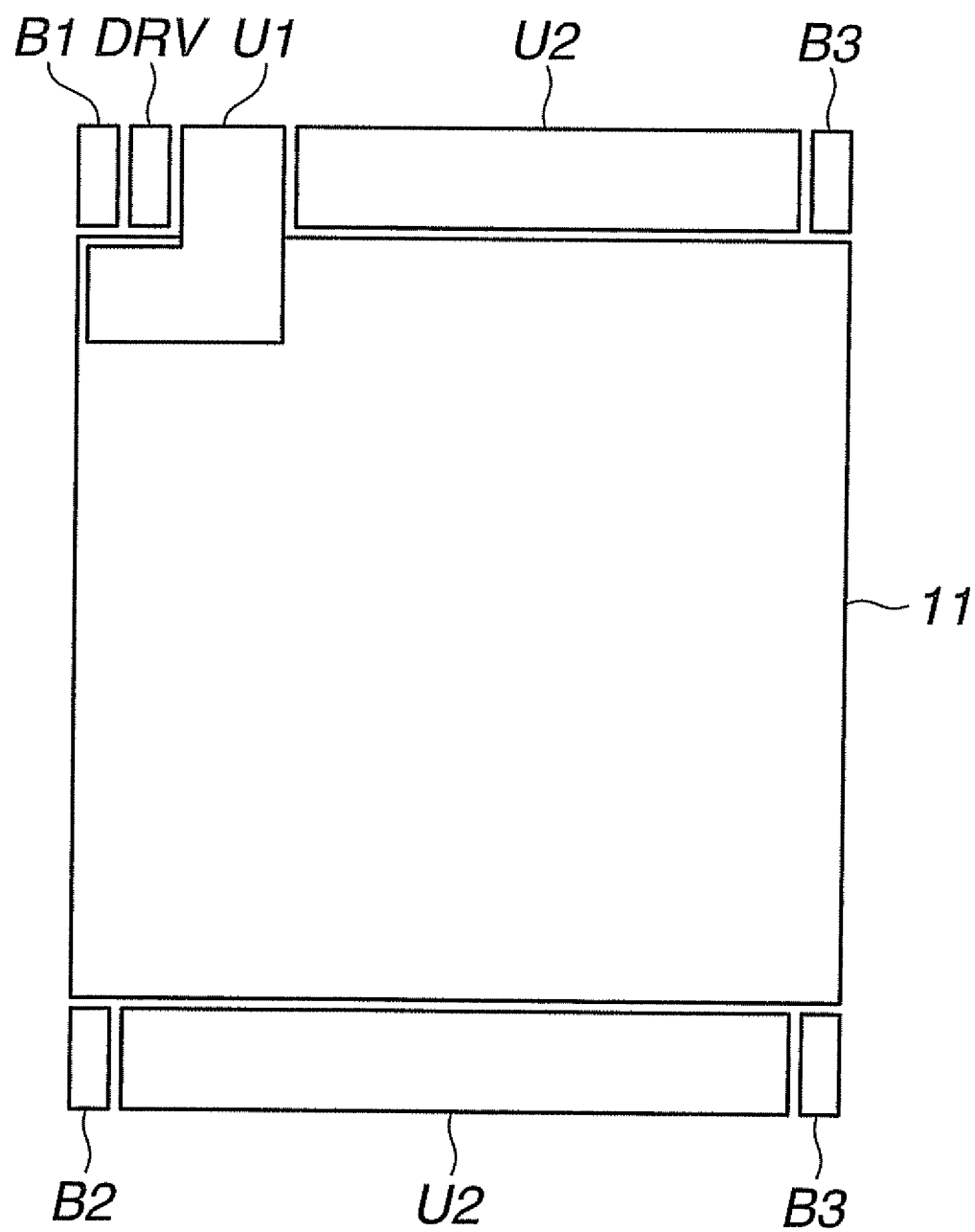
FIG. 12 is a layout diagram showing a layout when the circuit in FIG. 7 is configured on the LSI.

The example in FIG. 12 is an example which is obtained by applying the layout in FIG. 10 to the configuration in FIG. 9 and in which the buffers B3 are appropriately arranged when elements are arranged along upper and lower sides of the logic circuit 11. Note that the power switch section U1 is configured to include the capacitor C1 in FIG. 12 as well.

Third Embodiment

Figure 13:
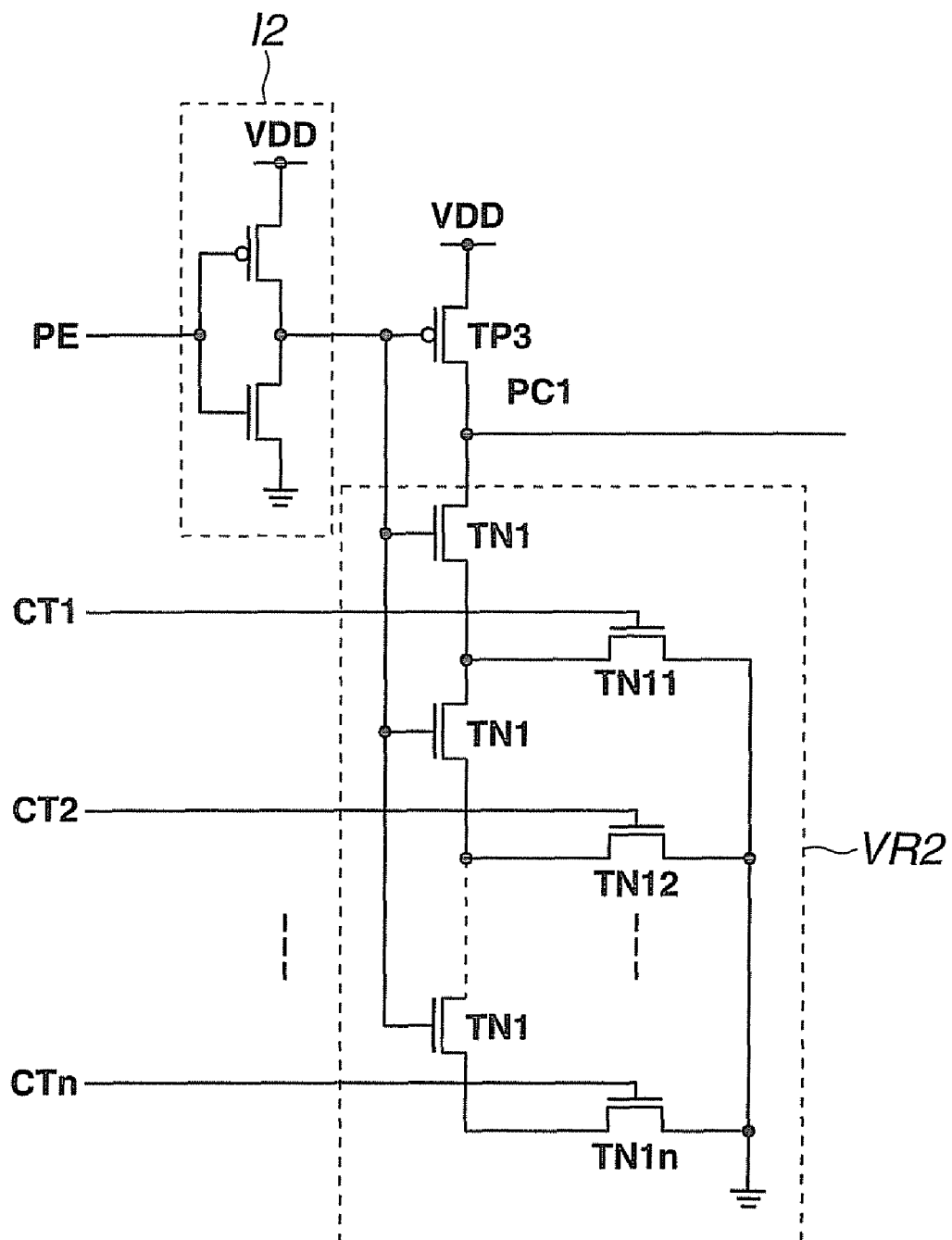
FIG. 13 is a circuit diagram showing a third embodiment of the present invention.

FIG. 13 is a circuit diagram showing a third embodiment of the present invention. In FIG. 13, the same components as in FIG. 1 are denoted by the same reference numerals, and a description of the components will be omitted.

The present embodiment is different from each of the above-described first and second embodiments in that an on-resistance section VR2 is adopted instead of the on-resistance section VR according to each of the embodiments.

If the power line voltage at the power line VDD changes, the on-resistance of the on-resistance section VR in, e.g., FIG. 1 changes. If the on-resistance changes, the transition time constant for the first control signal changes, and optimized control including suppression of rush current cannot be performed. For this reason, the present embodiment allows maintenance of the transition time constant for the first control signal at an optimum value by adopting the on-resistance section VR2 capable of controlling an on-resistance according to a power line voltage.

In FIG. 13, the on-resistance section VR2 is composed of a plurality of transistors TN1 and NMOS transistors TN11, TN12, ..., TN1$n$ ($n$ is a natural number). The plurality of transistors TN1 are cascoded, and sources of the transistors TN1 are connected to drains of the transistors TN11, TN12, ..., TN1$n$, respectively. Sources of the transistors TN11, TN12, ..., TN1$n$ are commonly connected to a ground. The plurality of transistors TN1 are turned on when a power control signal of an H level is supplied from an inverter I2 to gates.

Resistance control signals CT1, CT2, ..., CTn are supplied to gates of the transistors TN11, TN12, ..., TN1$n$. Only any one of the resistance control signals CT1, CT2, ..., CTn is H level while the other resistance control signals are L level. Of the transistors TN11, TN12, ..., TN1$n$, only one transistor to which the resistance control signal of an H level is supplied is turned on, and the drain of the transistor which is ON and the ground are connected to each other.

Accordingly, if an m-th transistor TN1$m$ ($m$ is a natural number) of the transistors TN11, TN12, ..., TN1$n$ is turned on when the transistor TN11 is ON, the state is equivalent to (m+1) NMOS transistors connected between a control line PC1 and the ground. An on-resistance based on the (m+1) transistors is obtained.

Values of the resistance control signals CT1, CT2, ..., CTn are set to increase the on-resistance of the on-resistance section VR2 with an increase in a voltage at a power line VDD and are set to decrease the on-resistance of the on-resistance section VR2 with a decrease in the voltage at the power line VDD.

Figure 14:
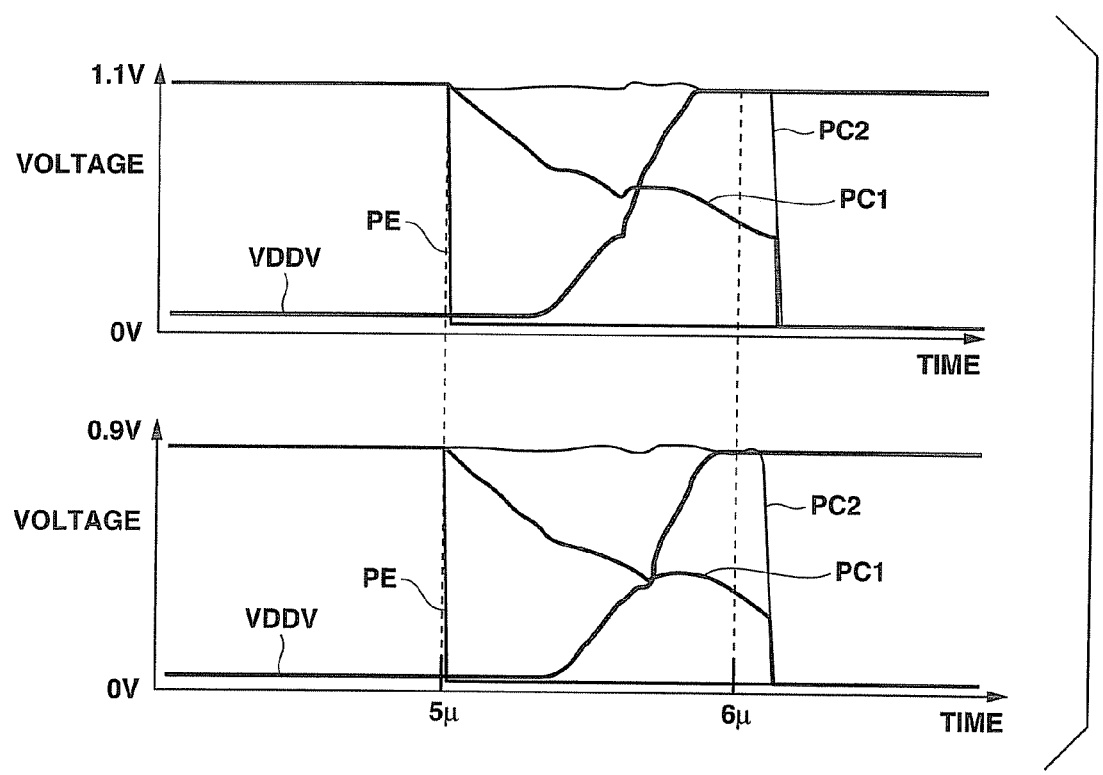
FIG. 14 is waveform charts for explaining operation of the third embodiment, in each of which an abscissa represents time, and an ordinate represents voltage or current.

Operation of the embodiment with the above-described configuration will be described with reference to FIG. 14. FIG. 14 shows waveform charts for explaining the operation of the third embodiment, in each of which an abscissa represents time, and an ordinate represents voltage. Reference characters VDDV in FIG. 14 denote a voltage at a virtual power line VDDV, reference characters PE denote a voltage of an inverted signal PE, reference characters PC1 denote a voltage of a first control signal, and reference characters PC2 denote a voltage of a second control signal. The upper waveform in FIG. 14 represents an example in which, when the voltage at the power line VDD is 1.1 V, only the resistance control signal CT4 is set to H level, and the other resistance control signals are set to L level. The lower waveform in FIG. 14 represents an example in which, when the voltage at the power line VDD is 0.9 V, only the resistance control signal CT2 is set to H level, and the other resistance control signals are set to L level. Note that FIG. 14 shows the waveforms obtained by applying the present embodiment to the second embodiment.

If the voltage at the power line VDD is 1.1 V, only the resistance control signal CT4 is set to H level. With the operation, the transistor TN14 is turned on, and the on-resistance section VR2 has an on-resistance based on five NMOS transistors. If the voltage at the power line VDD is 0.9 V, only the resistance control signal CT2 is set to H level. With the operation, the transistor TN12 is turned on, and the on-resistance section VR2 has an on-resistance based on three NMOS transistors.

An on-resistance of a transistor decreases with an increase in power line voltage and increases with a decrease in power line voltage. Accordingly, the on-resistance of the on-resistance section VR2 tends to decrease if the voltage at the power line VDD is high and tends to increase if the voltage at the power line VDD is low.

However, in the present embodiment, if the power line voltage at the power line VDD is high (e.g., 1.1 V), the on-resistance section VR2 causes the five transistors to prevent the on-resistance from decreasing using the resistance control signals. On the other hand, if the power line voltage at the power line VDD is low (e.g., 0.9 V), the on-resistance section VR2 causes the three transistors to prevent the on-resistance from increasing. In the above-described manner, the on-resistance section VR2 maintains a nearly constant on-resistance regardless of a change in the voltage at the power line VDD.

For this reason, in the present embodiment, a change in the first control signal after beginning of a rise in the voltage at the virtual power line VDDV remains nearly the same regardless of a change in the voltage at the power line VDD, as shown in FIG. 14.

As described above, according to the present embodiment, the same effects as in the above-described embodiments can be obtained. Additionally, even if the power line voltage at the power line VDD changes, rush current can be reliably suppressed by always maintaining the transition time constant for the first control signal at an optimum value.

Note that although an example in which power is supplied on the basis of the voltage at the power line VDD to the virtual power line VDDV has been described in each of the embodiments, it is apparent that the present invention can also be applied to a power control device which applies a ground line VSS to a virtual ground line VSSV in an LSI.

Figure 15:
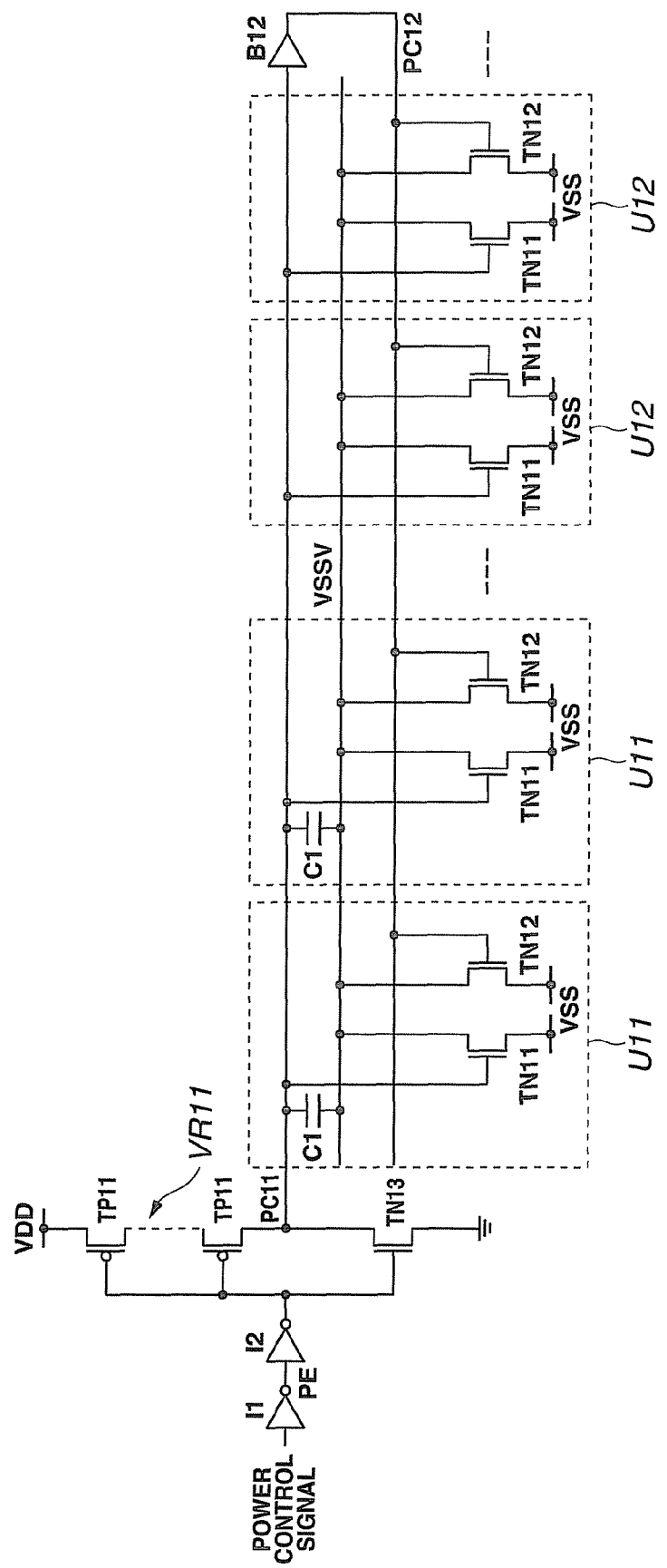
FIG. 15 is a circuit diagram showing a power control device for a virtual ground line VSSV.

FIG. 15 is a circuit diagram showing a circuit in the case. In FIG. 15, the same components as in FIG. 1 are denoted by the same reference numerals, and a description of the components will be omitted.

In FIG. 15, power switch sections U11 and U12 are adopted instead of the power switch sections U1 and U2 in FIG. 1. The power switch sections U11 and U12 each adopts NMOS transistors connected to a ground line VSS instead of the PMOS transistors TP1 and TP2. In the example in FIG. 15, the on-resistance section VR1 connected to the control line PC1 is composed of a plurality of PMOS transistors TP11 cascoded between the power line VDD and the control line PC11.

Other configurations and working effects are the same as in the embodiment in FIG. 1.

Note that although the circuit in FIG. 15 shows an example applied to the example in FIG. 1, it is apparent that the configuration can also be applied to the embodiments.

Having described the preferred embodiments of the invention referring to the accompanying drawings, it should understood that the present invention is not limited to those precise embodiments and various changes and modifications thereof could be made by one skilled in the art without departing from the spirit or scope of the invention as defined in the appended claims.

What is claimed is:

1. A semiconductor integrated circuit device comprising:
   at least one first transistor configured to control conductance between an input power line and an output power line;
   at least one second transistor configured to control conductance between the input power line and the output power line;
   a first buffer configured to supply a first control signal for driving the at least one first transistor to a first control line connected to the at least one first transistor;
   a second buffer configured to generate a second control signal for driving the at least one second transistor upon receipt of the first control signal supplied through the first control line and supply the second control signal to a second control line connected to the at least one second transistor; and
   at least one capacitor connected between the first control line and the output power line.

2. The semiconductor integrated circuit device according to claim 1, wherein
   a time required for a change in a level of the first control signal is longer than a time required for a change in a level of the second control signal.

3. The semiconductor integrated circuit device according to claim 2, wherein
   a capacitance which includes a capacitance of the at least one capacitor and a gate capacitance of the at least one first transistor and is connected to the first control line is set on the basis of a transition time constant for the first control signal which defines the time required for a change in the level of the first control signal.

4. The semiconductor integrated circuit device according to claim 1, wherein
   the at least one first transistor, the at least one second transistor, the first control line, the second control line, and the at least one capacitor are composed of
   at least one first power switch section which is composed of one of the at least one first transistor, one of the at least one second transistor, the first control line, the second control line, and one of the at least one capacitor and at least one second power switch section which is composed of one of the at least one first transistor, one of the at least one second transistor, the first control line, and the second control line.

5. The semiconductor integrated circuit device according to claim 4, wherein the number of the at least one first power switch section is set on the basis of a transition time constant which defines a time required for a change in a level of the first control signal.

6. The semiconductor integrated circuit device according to claim 1, wherein the first buffer includes a resistance component connected to the first control line, and a resistance value of the resistance component is set on the basis of a transition time constant for the first control signal which defines a time required for a change in a level of the first control signal.

7. The semiconductor integrated circuit device according to claim 6, wherein the resistance component is provided by an on-resistance of a transistor.

8. The semiconductor integrated circuit device according to claim 1, wherein the first buffer includes a P-type transistor and an N-type transistor complementarily connected between the input power line and a ground line, and the first control line is connected to a drain of the P-type and N-type transistors.

9. The semiconductor integrated circuit device according to claim 1, comprising a drive circuit which forcibly changes the first control signal to a level for turning on the at least one first transistor if the at least one second transistor is turned on by the second control signal from the second buffer.

10. The semiconductor integrated circuit device according to claim 1, comprising at least one third buffer provided on the second control line.

11. The semiconductor integrated circuit device according to claim 6, wherein the resistance value of the resistance component of the first buffer can vary according to a power line voltage at the input power line.

12. The semiconductor integrated circuit device according to claim 1, wherein an equivalent transistor size of the at least one second transistor is larger than an equivalent transistor size of the at least one first transistor.

13. The semiconductor integrated circuit device according to claim 12, wherein the number of the at least one second transistor is larger than the number of the at least one first transistor.

14. The semiconductor integrated circuit device according to claim 12, wherein a transistor size of each of the at least one second transistor is larger than a transistor size of each of the at least one first transistor.

15. The semiconductor integrated circuit device according to claim 1, wherein the input power line is a power line which takes in a power line voltage from a power source provided outside, and the output power line is a virtual power line for supplying the power line voltage to an internal logic.

16. The semiconductor integrated circuit device according to claim 1, wherein the input power line is a ground line which takes in a ground from an outside, and the output power line is a virtual ground line for supplying the ground to an internal logic.

17. The semiconductor integrated circuit device according to claim 1, wherein the first buffer and the second buffer are arranged at two ends, respectively, along one side of a formation region for a semiconductor integrated circuit, one of the at least one first transistor and one of the at least one second transistor are plurally arranged in alternation between the first and second buffers along the one side, and the at least one capacitor is arranged at an end portion of the one side.

18. The semiconductor integrated circuit device according to claim 17, wherein the first buffer and the second buffer are arranged at two ends along a side facing the one side, and one of the at least one first transistor and one of the at least one second transistor are plurally arranged in alternation between the first and second buffers along the facing side.

19. The semiconductor integrated circuit device according to claim 1, wherein the first buffer, the at least one first transistor, the second buffer, and the at least one second transistor are arranged along one side of a formation region for a semiconductor integrated circuit, and the at least one capacitor is arranged at an end portion of the one side.

20. The semiconductor integrated circuit device according to claim 4, wherein the first buffer and the second buffer are arranged at two ends along one side of a formation region for a semiconductor integrated circuit, and the at least one first power switch section and the at least one second power switch section are arranged between the first and second buffers along the one side.

* * * * *